United States Patent
Kim

(10) Patent No.: US 9,372,238 B2
(45) Date of Patent: Jun. 21, 2016

(54) BATTERY MANAGEMENT SYSTEM WITH OVER-DISCHARGE DETECTION AND WARNING, BATTERY PACK COMPRISING THE SAME, AND METHOD FOR PROTECTING A BATTERY FROM OVER-DISCHARGE

(75) Inventor: Youngbok Kim, Yongin-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 291 days.

(21) Appl. No.: 13/418,083

(22) Filed: Mar. 12, 2012

(65) Prior Publication Data

US 2012/0229288 A1 Sep. 13, 2012

(30) Foreign Application Priority Data

Mar. 11, 2011 (KR) .................. 10-2011-0021924

(51) Int. Cl.
G08B 21/00 (2006.01)
G01R 31/36 (2006.01)
G01R 19/165 (2006.01)

(52) U.S. Cl.
CPC ........ G01R 31/362 (2013.01); *G01R 19/16542* (2013.01); *G01R 31/3682* (2013.01)

(58) Field of Classification Search
CPC ........... G01R 19/16542; G01R 31/362; G01R 31/3655; G01R 31/3682; H01M 10/4257; H01M 10/48; H01M 2/34; H01M 2010/4271; H01M 2010/4278; H02J 7/0004; H02J 7/0077; H02J 2007/005; H02J 2009/007; H02J 7/0011; H02J 7/0031; Y02T 10/7005; Y02T 10/705; Y02T 90/16

USPC ................ 320/127, 130, 132, 134, 135, 136; 324/426, 429, 433; 340/636.1, 636.15, 340/636.16, 636.17; 702/63
See application file for complete search history.

(56) References Cited

U.S. PATENT DOCUMENTS

| | | | | |
|---|---|---|---|---|
| 4,965,738 A | * | 10/1990 | Bauer et al. | 320/136 |
| 5,514,946 A | * | 5/1996 | Lin et al. | 702/63 |
| 6,087,803 A | * | 7/2000 | Eguchi et al. | 320/106 |
| 6,157,169 A | | 12/2000 | Lee | |
| 6,590,396 B1 | * | 7/2003 | Zur | H02J 7/1461 324/433 |

(Continued)

FOREIGN PATENT DOCUMENTS

| | | |
|---|---|---|
| JP | 2002-010503 A | 1/2002 |
| JP | 2005-261073 A | 9/2005 |

(Continued)

OTHER PUBLICATIONS

Korean Notice of Allowance dated Nov. 29, 2012 for Korean Patent Application No. KR 10-2011-0021924 which corresponds to captioned U.S. Appl. No. 13/418,083.

(Continued)

*Primary Examiner* — Fekadeselassie Girma
*Assistant Examiner* — Stephen Burgdorf
(74) *Attorney, Agent, or Firm* — Knobbe, Martens, Olson & Bear, LLP

(57) ABSTRACT

A battery management system and a battery pack are disclosed. The battery management system determines that a battery is in a non-use state, and thereafter, detects a battery voltage of the battery. If the battery voltage is less than an over-discharge reference voltage, the system generates a warning signal.

14 Claims, 2 Drawing Sheets

(56) References Cited

U.S. PATENT DOCUMENTS

| | | |
|---|---|---|
| 8,022,661 B1 * | 9/2011 | Bauer .................... 320/101 |
| 8,154,253 B2 * | 4/2012 | Omagari ................ 320/134 |
| 2002/0021108 A1 | 2/2002 | Suzuki et al. |
| 2002/0093312 A1 * | 7/2002 | Choo ............ G01R 31/3624 320/149 |
| 2004/0135696 A1 * | 7/2004 | Hasegawa ............. 340/636.1 |
| 2006/0176026 A1 * | 8/2006 | Shen et al. ............ 320/135 |
| 2007/0170893 A1 * | 7/2007 | Kao et al. .............. 320/132 |
| 2007/0239374 A1 * | 10/2007 | Dougherty et al. ....... 702/63 |
| 2008/0224662 A1 * | 9/2008 | Hayakawa ............. 320/128 |
| 2009/0015418 A1 * | 1/2009 | Koike .................. 340/636.1 |
| 2009/0212742 A1 * | 8/2009 | Sim et al. .............. 320/134 |

FOREIGN PATENT DOCUMENTS

| | | |
|---|---|---|
| KR | 1998-079177 A | 11/1998 |
| KR | 10-1999-0070581 A | 9/1999 |
| KR | 10-2006-0026147 A | 3/2006 |
| KR | 10-2006-0037830 A | 5/2006 |

OTHER PUBLICATIONS

Korean Office Action dated Jun. 11, 2012 for Korean Patent Application No. KR 10-2011-0021924 which corresponds to captioned U.S. Appl. No. 13/418,083.

* cited by examiner

BATTERY MANAGEMENT SYSTEM WITH OVER-DISCHARGE DETECTION AND WARNING, BATTERY PACK COMPRISING THE SAME, AND METHOD FOR PROTECTING A BATTERY FROM OVER-DISCHARGE

CROSS-REFERENCE TO RELATED APPLICATIONS

This application claims priority to and the benefit of Korean Patent Application No. 10-2011-0021924, filed on Mar. 11, 2011, the entire content of which is incorporated herein by reference.

BACKGROUND

1. Field

The disclosed technology relates to a battery management system and a battery pack comprising the same.

2. Description of the Related Technology

Secondary batteries have been improved with the development of portable electronic equipment such as cellular phones, notebook computers, camcorders, personal digital assistants (PDA), and the like.

Secondary batteries may be manufactured in the form of a battery pack including a battery cell and a charger/discharger circuit. The battery cell is charged by an external power supply or discharged by an external system connected to a terminal in the battery pack. Accordingly, if the external power supply is connected to the battery pack, the battery cell is charged by the power supplied through the external terminal and the charger/discharger circuit. Furthermore, if the external system is connected to the battery pack, power of the battery cell is discharged and supplied to an external load by the external terminal and the charger/discharger circuit.

In general, if a battery pack is left for a long time without being used, the battery pack may be over-discharged. An over-discharged battery pack can be repaired. When the over-discharged battery pack is repaired, it is necessary to accurately identify a state of the battery pack.

SUMMARY OF CERTAIN INVENTIVE ASPECTS

One inventive aspect is a battery management system. The system includes a recognition unit configured to determine that a battery is in a non-use state if the battery is not in use for a period of time. The system also includes a detection unit configured to detect a battery voltage of the battery while the battery is in the non-use state, and an indicating unit configured to compare the battery voltage detected by the detection unit with an over-discharge reference voltage and, if the battery voltage is less than the over-discharge reference voltage, to generate an over-discharge warning signal.

Another inventive aspect is a battery pack including a battery including at least one battery cell, and a battery management unit configured to identify a non-use state of the battery if the battery is not used for a period of time. The battery management unit includes a recognition unit configured to determine that a battery is in a non-use state if the battery is not in use for a period of time. The system also includes a detection unit configured to detect a battery voltage of the battery while the battery is in the non-use state, and an indicating unit configured to compare the battery voltage detected by the detection unit with an over-discharge reference voltage and, if the battery voltage is less than the over-discharge reference voltage, to generate an over-discharge warning signal.

Another inventive aspect is a method of protecting a battery. The method includes determining that a battery is in a non-use state if the battery is not in use for a period of time, detecting a battery voltage of the battery while the battery is in the non-use state, comparing the battery voltage with an over-discharge reference voltage and, if the battery voltage is less than the over-discharge reference voltage, generating an over-discharge warning signal.

BRIEF DESCRIPTION OF THE DRAWINGS

Various objects, features and advantages of certain embodiments will be more apparent from the following detailed description in conjunction with the accompanying drawings, in which.

DETAILED DESCRIPTION OF CERTAIN INVENTIVE EMBODIMENTS

Hereinafter, certain embodiments are described in detail with reference to the accompanying drawings.

Figure 1:
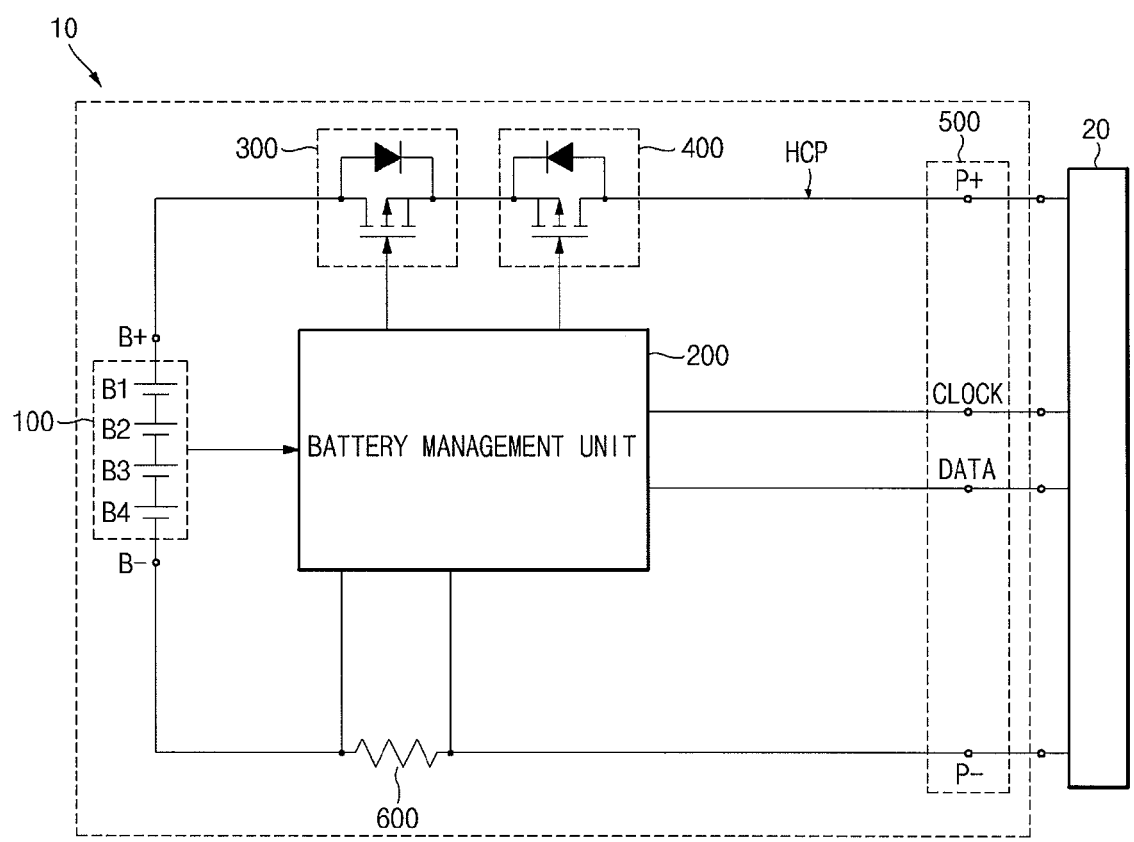
FIG. 1 is a circuit view illustrating a battery pack according to an embodiment.

A battery pack 10 according to an embodiment is described. FIG. 1 is a circuit view illustrating battery pack 10. Referring to FIG. 1, the battery pack 10 includes a battery 100, a battery management unit 200, a charging device 300, a discharging device 400, a connector 500 and a sense resistor 600. The battery pack 10 may be connected to an external system 20 through the connector 500. The external system 20 may include, for example, a charger for charging the battery 100, or an external load such as a cellular phone or a portable notebook computer.

The battery pack 10 may be connected to the charger 20 through the connector 500 to perform charging of the battery 100. Alternatively, the battery pack 10 may be connected to the external load 20 such as a cellular phone or a portable notebook computer through the connector 500 to perform discharging of the battery 100. A high-current path (HCP) between the battery 100 and the connector 500 is used as a charging/discharging path, and a relatively large amount of current may flow through the HCP. Power terminals of the charger or external load 20 are connected to a first pack terminal P+ and a second pack terminal P− of the connector 500, and communication terminals of the charger 20 may be connected to communication terminals CLOCK and DATA of the connector 500.

The battery 100 may include one or more battery cells B1, B2, B3, and B4, and may be charged or discharged with a preset voltage. In FIG. 1, reference symbols B+ and B− denote electrode terminals of the battery 100. Positive terminal B+ and negative terminal B− form the electrode terminals of the battery 100, which includes serially connected battery cells B1, B2, B3, and B4. The number of battery cells of the battery 100 may vary according to the capacity required by the external load.

The battery management unit 200 detects a voltage of the battery 100 and controls the charging device 300 and the discharging device 400, thereby controlling charging and discharging of the battery 100. For example, when the battery pack 10 is connected to the charger 20 through the connector 500, the battery management unit 200 sets the charging device 300 to an ON state and the discharging device 400 to an OFF state, thereby allowing the battery 100 to be charged. Alternatively, when the battery pack 10 is connected to the external system 20 through the connector 500, the battery management unit 200 sets the charging device 300 to an OFF state and the discharging device 400 to an ON state, thereby allowing the battery 100 to be discharged. Although not shown, the battery management unit 200 can detect each of the voltages of the respective battery cells B1, B2, B3, and B4. In addition, the battery management unit 200 may be configured such that a state of the battery 100 can be identified and stored while the battery pack 10 is left for a certain time without being used, which will later be described in detail.

The charging device 300 and the discharging device 400 are connected on the HCP between the battery 100 and the connector 500 and control charging and discharging of the battery 100. The charging device 300 may include a field effect transistor (to be referred to as FET1) and a parasitic diode (to be referred to as D1). The discharging device 400 may include a field effect transistor (to be referred to as FET2) and a parasitic diode (to be referred to as D2). A connected direction in which a source and a drain of FET1 are connected may be opposite to that of FET2. With this configuration, FET1 limits the flow of current from the connector 500 to the battery 100. FET2 may be configured to limit the flow of current from the battery 100 to the connector 500. D1 and D2 may be configured to allow the current to flow in a direction opposite to the direction in which the flow of current is limited.

The connector 500 is connected to the external system 20, and may serve as a charging terminal for charging electricity to the battery 100 while connected to the charger 20 during charging, or as a discharging terminal for discharging the battery 100 while being connected to the external load 20 during discharging. The connector 500 may include a first pack terminal P+ and a second pack terminal P−. The first pack terminal P+ may be a positive pack terminal connected to the positive electrode terminal B+ of the battery 100. The second pack terminal P− may be a negative pack terminal connected to the negative electrode terminal B− of the battery 100.

If the charger 20 is connected to the connector 500, charging from the charger 20 to the battery 100 may be performed. If the external load 20 is connected to the connector 500, discharging from the battery 100 to the charger 20 may be performed.

In addition, the connector 500 may include the communication terminals CLOCK and DATA connected to the battery management unit 200. The communication terminals CLOCK and DATA may include a clock terminal CLOCK and a data terminal DATA. If the charger 20 is connected to the connector 500, the communication terminals CLOCK and DATA enable communication between the battery management unit 200 and the charger 20. For example, the communication terminals CLOCK and DATA may transmit voltage information or charge control information of the battery 100 from the battery management unit 200 to the charger 20. Alternatively, the communication terminals CLOCK and DATA may transmit an alarm signal output from the battery management unit 200 to the external system 20.

The sense resistor 600 may be provided on the HCP between the battery 100 and the connector 500. In detail, the sense resistor 600 may be connected between the negative terminal B− of the battery 100 and the second pack terminal P−. In addition, the sense resistor 600 may be connected to the battery management unit 200. Accordingly, the sense resistor 600 allows the battery management unit 200 to sense voltages at both ends of the sense resistor 600 and a resistance value of the sense resistor 600, thereby identifying charging and discharging currents. Thus, the sense resistor 600 transmits information regarding the charging current or discharging current of the battery 100 to the battery management unit 200.

Figure 2:
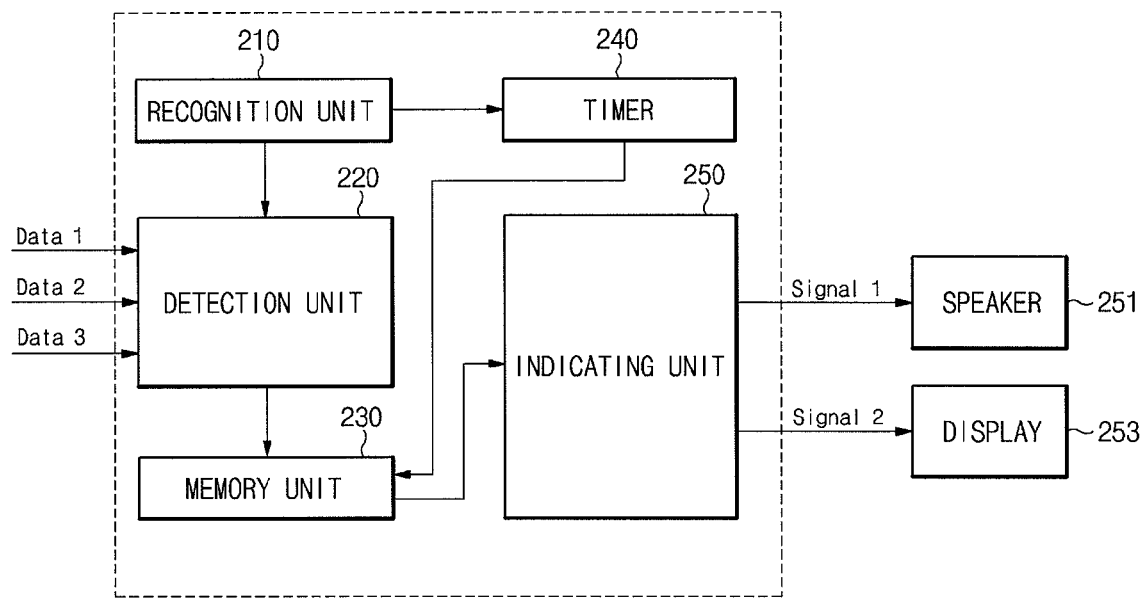
FIG. 2 is a block diagram of a battery management system according to an embodiment.

Hereinafter, a structure of a battery management system 200 according to an embodiment is described in detail. FIG. 2 is a block diagram of a battery management system 200A according to an embodiment. In this embodiment, the battery management unit 200 includes the battery management system 200A. Referring to FIG. 2, the battery management system 200A includes a recognition unit 210, a detection unit 220, a memory unit 230, a timer 240 and an indicating unit 250.

In an event that the battery pack 10 is not in use for a predetermined period of time, the recognition unit 210 senses that event and determines a state of the battery 100 as being unused. The recognition unit 210 may transmit a recognition signal indicating that the battery 100 is unused to the detection unit 220 and the timer 240. The recognition unit 210 may determine extended lack of use of the battery 100 based on current below a threshold and/or whether or not the connector 500 and the external system 20 are connected to each other and how much time has passed since the connector 500 and the external system 20 have not been connected to each other. The processed data of the detection unit 220 and the timer 240 is stored in the memory unit 230.

The detection unit 220 may receive a recognition signal from the recognition unit 210 and may detect information (Data 1, 2 and 3) regarding the battery 100. The information regarding the battery 100 may include data about the voltage, current and temperature of the battery 100, which are referred to as Data 1, 2 and 3, respectively. The detection unit 220 may obtain the information (Data 1, 2 and 3) regarding the battery 100 from the battery management unit 200. The detected information (Data 1, 2 and 3) regarding the battery 100 is stored in the memory unit 230. Here, the information (Data 1, 2 and 3) regarding the battery 100 can be obtained from the battery management unit 200, and the detection unit 220 may detect the Data 1, 2 and 3 while the battery is unused. The information (Data 1, 2 and 3) regarding the battery 100 may include information regarding the elapsed time of unused state, which may be obtained such that after the timer 240 receives a recognition signal from the recognition unit 210, the time information is stored in the memory unit 230. The information regarding the battery 100 may be used to identify the use environment of the battery 100 immediately before the battery pack 10 is left unused.

The memory unit 230 may store the information (Data 1, 2 and 3) regarding the battery 100, detected by the detection unit 220, and the information regarding the elapsed time of the neglect mode, obtained from the timer 240. In addition, the memory unit 230 may transfer the stored information to the indicating unit 250.

The indicating unit 250 compares a voltage of the battery 100 detected by the detection unit 220 with a preset over-discharge reference voltage and, if the battery voltage is equal to or less than the over-discharge reference voltage, the indicating unit 250 generates an over-discharge warning signal (Signal 1). In some embodiments, the indicating unit 250 further includes a speaker 251, which generates an audible warning sound in response to the warning signal (Signal 1).

The over-discharge reference voltage may be set to a value greater than a minimum over-discharge voltage value of the battery 100. This is for the purpose of preventing the battery pack 10 from malfunctioning or from being damaged when the voltage level of the battery 100 reaches the minimum over-discharge voltage value. In this regard, it is advantageous to recognize that the voltage of the battery 100 is near the minimum over-discharge voltage value before it reaches the minimum over-discharge voltage value. Thus, the over-discharge reference voltage may be set to a value greater than the minimum over-discharge voltage value of the battery 100, that is, an over-discharge reference voltage. The minimum over-discharge voltage may differ according to the specification of a battery pack. In some embodiments, the minimum over-discharge voltage may be set to approximately 1.5 V, and the over-discharge reference voltage may be set to approximately 2.5 V.

The indicating unit 250 may also generate an alarm signal (Signal 2) for displaying data stored in the memory unit 230. In such embodiments, the indicating unit 250 may further include a display 253. The display 253 may be a display device or an indicator light, such as a light emitting diode, which responds to the alarm signal (Signal 2) by generating a visible warning signal. The display may also indicate information regarding the battery 100, the information including the voltage, current, temperature of the battery 100, and the elapsed time of non-use. If the control unit 250 is connected to the external system 20, it may transmit the alarm signal to the external system 20 to allow the information regarding the battery 100 to be displayed through the external system 20.

Thus, the speaker 251 and the display 253 receive alarm signals from the indicating unit 250 and indicate information regarding the corresponding signal.

In some embodiments of a method of protecting a battery, if a battery is not in use for more than a predetermined period of time, a battery voltage of the battery is detected. Such embodiments also include comparing the battery voltage with an over-discharge reference voltage, and, if the battery voltage is less than the over-discharge reference voltage, generating a warning signal. Such embodiments may additionally include one or more of the following:

storing the battery voltage and a duration of non-use in a memory,
generating a visible indication of the warning signal,
generating an audible indication of the warning signal,
determining that a battery is not in use as a result of the battery not being connected to an external system, and
determining that a battery is not in use as a result of the battery current being below a threshold.

According to some embodiments, the user can be warned of a battery charge state before the battery is over-discharged while the battery pack is unused, thereby reducing the failure rate of the battery pack. In addition, when a battery pack is left unused, since information regarding the duration of the non-use can be identified and stored, the defective battery pack can be accurately examined.

Although exemplary embodiments have been described in detail hereinabove, it should be understood that many variations and modifications of the basic inventive concepts herein described, which may appear to those skilled in the art, fall within the spirit and scope of the exemplary embodiments.

What is claimed is:

1. A battery management system comprising:
   a recognition unit configured to determine that a battery is in a non-use state if the battery is not in use for a period of time and to generate a recognition signal, wherein the recognition unit is configured to determine that a battery is in the non-use state if the battery current is below a threshold;
   a timer configured to receive the recognition signal from the recognition unit and provide elapsed time of the non-use state of the battery, wherein the elapsed time of the non-use state includes an elapsed time of neglect after receiving the recognition signal;
   a detection unit directly connected to at least the recognition unit and the battery, the detection unit configured to receive the recognition signal and to detect a battery voltage, the battery current and a battery temperature of the battery while the battery is in the non-use state;
   an indicating unit configured to compare the battery voltage detected by the detection unit with an over-discharge reference voltage and, if the battery voltage is less than the over-discharge reference voltage, to generate a warning signal and communicate the elapsed time of the non-use state of the battery, the battery voltage, the battery current and the battery temperature to a display; and
   a memory unit configured to store the battery voltage, the battery current the battery temperature and the elapsed time of the non-use state of the battery, wherein the memory unit is directly connected to the detection unit.

2. The battery management system of claim 1, wherein the indicating unit further comprises a display configured to generate a visible indication of the warning signal.

3. The battery management system of claim 1, wherein the indicating unit further comprises a speaker configured to generate an audible indication of the warning signal.

4. The battery management system of claim 1, wherein the recognition unit is configured to determine that a battery is in the non-use state if the battery is not connected to an external system, wherein the external system comprises a clock terminal and a data terminal to communicate with the battery, wherein the recognition signal is generated based on the battery not being connected to the clock terminal and data terminal.

5. The battery management system of claim 1, wherein the over-discharge reference voltage is set to be a value greater than a predetermined minimum over-discharge voltage.

6. A battery pack comprising:
   a battery including at least one battery cell; and
   a battery management unit configured to identify a non-use state of the battery if the battery is not used for a period of time,
   wherein the battery management unit comprises:
      a recognition unit configured to determine that a battery is in a non-use state if the battery is neither being charged nor discharged for a period of time and to generate a recognition signal, wherein the recognition unit is configured to determine that a battery is in the non-use state if the battery current is below a threshold;
      a timer configured to receive the recognition signal from the recognition unit and provide elapsed time of the non-use state of the battery, wherein the elapsed time of the non-use state includes an elapsed time of neglect after receiving the recognition signal;
      a detection unit directly connected to at least the recognition unit and the battery, the detection unit configured to receive the recognition signal and to detect a battery voltage, the battery current and a battery temperature of the battery while the battery is in the non-use state;
      an indicating unit configured to compare the battery voltage detected by the detection unit with an over-discharge reference voltage and, if the battery voltage is less than the over-discharge reference voltage, to generate an over-discharge warning signal and communicate the elapsed time of the non-use state of the battery, the battery voltage, the battery current and the battery temperature to a display; and a memory unit configured to store the battery voltage, the battery current, the battery temperature and the elapsed time of the non-use state of the battery, wherein the memory unit is directly connected to the detection unit.

7. The battery pack of claim 6, wherein the indicating unit further comprises a display configured to generate a visible indication of the warning signal.

8. The battery pack of claim 6, wherein the indicating unit further comprises a speaker configured to generate an audible indication of the warning signal.

9. The battery pack of claim 6, wherein the recognition unit is configured to determine that a battery is in the non-use state if the battery is not connected to an external system.

10. A method of protecting a battery, the method comprising:

determining that a battery is not in use as a result of the battery current being below a threshold;

while a battery is not in use for more than a predetermined period of time, detecting a battery voltage, a battery current and a battery temperature of the battery;

if determining that the battery is not in use, providing elapsed time of the non-use state of the battery, wherein the elapsed time of the non-use state includes an elapsed time of neglect after determining the battery is not in use;

setting an over-discharge reference voltage to be a value greater than a predetermined minimum over-discharge voltage for the battery;

comparing the battery voltage with the over-discharge reference voltage; and, if the battery voltage is less than the over-discharge reference voltage, generating a warning signal and communicating the elapsed time of the non-use state of the battery, the battery voltage, the battery current and the battery temperature to a display.

11. The method of claim 10, further comprising storing the battery voltage and a duration of non-use in a memory.

12. The method of claim 10, further comprising generating a visible indication of the warning signal.

13. The method of claim 10, further comprising generating an audible indication of the warning signal.

14. The method of claim 10, further comprising determining that a battery is not in use as a result of the battery not being connected to an external system.

* * * * *